US012692619B2

(12) United States Patent
Kaneko et al.

(10) Patent No.: US 12,692,619 B2
(45) Date of Patent: Jul. 28, 2026

(54) METHOD FOR PRODUCING ALUMINUM NITRIDE SUBSTRATE, ALUMINUM NITRIDE SUBSTRATE, AND METHOD FOR SUPPRESSING INTRODUCTION OF DISLOCATION INTO ALUMINUM NITRIDE GROWTH LAYER

(71) Applicants: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

(72) Inventors: Tadaaki Kaneko, Sanda (JP); Daichi Dojima, Sanda (JP); Taku Murakawa, Sanda (JP); Moeko Matsubara, Osaka (JP); Yoshitaka Nishio, Osaka (JP)

(73) Assignees: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

( * ) Notice: Subject to any disclaimer, the term of this patent is extended or adjusted under 35 U.S.C. 154(b) by 910 days.

(21) Appl. No.: 17/919,174

(22) PCT Filed: Mar. 30, 2021

(86) PCT No.: PCT/JP2021/013751
§ 371 (c)(1),
(2) Date: Aug. 1, 2023

(87) PCT Pub. No.: WO2021/210398
PCT Pub. Date: Oct. 21, 2021

(65) Prior Publication Data
US 2023/0392282 A1 Dec. 7, 2023

(30) Foreign Application Priority Data

Apr. 14, 2020 (JP) ................................. 2020-072555

(51) Int. Cl.
*C30B 23/02* (2006.01)
*C30B 29/40* (2006.01)

(52) U.S. Cl.
CPC .......... *C30B 23/025* (2013.01); *C30B 29/403* (2013.01)

(58) Field of Classification Search
CPC ....... C30B 23/025; C30B 23/04; C30B 29/36; C30B 29/403; C30B 33/02; C30B 33/12
See application file for complete search history.

(56) References Cited

U.S. PATENT DOCUMENTS

2006/0272572 A1 12/2006 Uematsu et al.
2011/0198560 A1 8/2011 Okagawa et al.
(Continued)

FOREIGN PATENT DOCUMENTS

CN 101140865 A 3/2008
CN 102586879 A * 7/2012 ............. C30B 29/38
(Continued)

OTHER PUBLICATIONS

English computer translation of CN-102586879-A (Year: 2025).*
(Continued)

*Primary Examiner* — Matthew J Song
(74) *Attorney, Agent, or Firm* — Calfee, Halter & Griswold LLP

(57) ABSTRACT

A problem addressed by the present invention is to provide a novel technique with which is possible to suppress the introduction of dislocation into a growth layer. The present invention, which solves the above problem, is a method for producing an aluminum nitride substrate, the method including a processing step for removing part of silicon carbide
(Continued)

substrate and forming a pattern that includes a minor angle, and a crystal growth step for forming an aluminum nitride growth layer on the silicon carbide substrate on which the patter has been formed. The present invention is also a method for suppressing the introduction of dislocation into the aluminum nitride growth layer, the method including a processing step for removing part of the silicon carbide substrate and forming a pattern that includes a minor angle before forming a growth layer on a base substrate.

20 Claims, 10 Drawing Sheets

(56)                    References Cited

U.S. PATENT DOCUMENTS

| | | | | |
|---|---|---|---|---|
| 2018/0083163 | A1* | 3/2018 | Saito | ................. H10H 20/0137 |
| 2018/0158681 | A1 | 6/2018 | Fujikura et al. | |
| 2018/0350700 | A1 | 12/2018 | Watanabe | |
| 2020/0402922 | A1 | 12/2020 | Ouchi et al. | |

FOREIGN PATENT DOCUMENTS

| | | |
|---|---|---|
| CN | 108155278 A | 6/2018 |
| CN | 110886018 A | 3/2020 |
| JP | H10312971 A | 11/1998 |
| JP | 2007-223821 A | 9/2007 |
| JP | 2007-254258 A | 10/2007 |
| JP | 2010-042950 A | 2/2010 |
| JP | 2018-056551 A | 4/2018 |
| JP | 2018-206928 A | 12/2018 |
| JP | 2019-102767 A | 6/2019 |
| TW | 201736250 A | 10/2017 |
| WO | 2009/102033 A1 | 8/2009 |
| WO | 2012093601 A1 | 7/2012 |
| WO | 2016/147786 A1 | 9/2016 |

OTHER PUBLICATIONS

EPO Communication and European Search Report issued in corresponding EP application No. 21788962.5 on Apr. 24, 2024 (8 pages).

Kamber et al., "Lateral epitaxial overgrowth of aluminum nitride on patterned silicon carbide substrates by hydride vapor phase epitaxy", Applied Physics Letter (2007), vol. 90, No. 12, pp. 122116-1-122116-3.

English translation of International Search Report from PCT/JP2021/013751 dated Jun. 15, 2021 (3 pages).

* cited by examiner (a)

(b)

( a )

( b )

( c )

SMALL ▬▬▬▬▬▬▬▬▬▬ LARGE

FWHM

METHOD FOR PRODUCING ALUMINUM NITRIDE SUBSTRATE, ALUMINUM NITRIDE SUBSTRATE, AND METHOD FOR SUPPRESSING INTRODUCTION OF DISLOCATION INTO ALUMINUM NITRIDE GROWTH LAYER

CROSS-REFERENCE TO RELATED APPLICATIONS

This application is a 371 of PCT Application No. PCT/JP2021/013751, filed on Mar. 30, 2021, which claims priority to Japanese Application No. 2020-072555, filed on Apr. 14, 2020, the contents of which are hereby incorporated by reference as if recited in their entirety.

TECHNICAL FIELD

The present invention relates to a method for manufacturing an aluminum nitride substrate, and a method for suppressing introduction of dislocations into an aluminum nitride substrate and an aluminum nitride growth layer.

BACKGROUND ART

Conventionally, in a method for manufacturing an aluminum nitride substrate, a semiconductor substrate made of a desired semiconductor material is manufactured by crystal-growing (a so-called epitaxial growth) a semiconductor material on an underlying substrate.

In the epitaxial growth described above, it has been regarded as a problem that dislocations are introduced into a growth layer by taking over the dislocations of an underlying substrate to the growth layer.

Patent Literature 1 discloses an invention in which a groove portion is provided in a silicon carbide (SiC) substrate that is an example of an underlying substrate to perform a crystal growth progressing along a direction orthogonal to a c-axis direction, thereby suppressing takeover of a threading dislocation existing in the SiC substrate and propagating in the c-axis direction.

CITATION LIST

Patent Literature

Patent Literature 1: JP 2007-223821 A

SUMMARY OF INVENTION

Technical Problem

However, it can be understood that there is room for improvement in the above invention from the viewpoint of suppressing introduction of new dislocations that may occur in bonding between crystal growth surfaces progressing along a direction orthogonal to a c-axis direction.

An object of the present invention is to provide a novel technique capable of suppressing introduction of dislocations into an aluminum nitride growth layer.

Solution to Problem

The present invention to solve the problems described above is a method for manufacturing an aluminum nitride substrate, the method including: a processing step of removing a part of a silicon carbide substrate to form a pattern with a minor angle; and a crystal growth step of forming an aluminum nitride growth layer on the silicon carbide substrate on which the pattern is formed.

As described above, the present invention can suppress the introduction of dislocations into the growth layer by performing the crystal growth on an underlying substrate having the pattern with a minor angle.

In a preferred mode of the present invention, in the crystal growth step, a zippering bonding is performed on the silicon carbide substrate to form an aluminum nitride growth layer. As described above, the present invention can realize the zippering bonding capable of suppressing the introduction of new dislocations by performing crystal growth on the underlying substrate having the pattern with a minor angle.

In a preferred mode of the present invention, in the crystal growth step, the aluminum nitride growth layer is formed by performing the crystal growth proceeding along a c-axis direction and performing the crystal growth proceeding along an a-axis direction. As described above, in the present invention, it is possible to form a region that does not take over the dislocations of the underlying substrate in the formation of the growth layer.

In a preferred mode of the present invention, the crystal growth step is a step of growing via a physical vapor transport method. As described above, the present invention can realize the formation of the growth layer based on the source transportation using a temperature gradient or a chemical potential as a driving force.

In a preferred mode of the present invention, the silicon carbide substrate and the aluminum nitride growth layer are made of different materials.

In a preferred mode of the present invention, the processing step includes a through hole formation step of removing a part of the silicon carbide substrate to form through holes, and a strained layer removal step of removing a strained layer introduced in the through hole formation step. As described above, in the present invention, it is easy to form the temperature gradient in the a-axis direction that becomes the driving force in the crystal growth proceeding along the a-axis direction.

In a preferred mode of the present invention, the through hole formation step is a step of forming the through holes by irradiating the silicon carbide substrate with a laser. As described above, in the present invention, the pattern with a minor angle can be formed based on the processing of the underlying substrate without machining.

In a preferred mode of the present invention, the strained layer removal step is a step of removing the strained layer of the silicon carbide substrate by heat treatment. As described above, the present invention can reduce a defect density in the pattern with a minor angle.

In a preferred mode of the present invention, the silicon carbide substrate is silicon carbide, and the strained layer removal step is a step of etching the silicon carbide substrate under a silicon atmosphere. In this way, the present invention can planarize an upper wall and side walls in the pattern with a minor angle.

In a preferred mode of the present invention, the pattern is a regular m-gonal shape, and the m is a natural number larger than 2.

In a preferred mode of the present invention, the pattern is a 4n-gonal shape, including a reference figure which is a regular n-gonal shape including n vertices included in vertices of the pattern, and includes a first line segment extending from each of the n vertices and a second line segment adjacent to the first line segment without extending from any of the n vertices, the n is a natural number larger than 2, and an angle formed by two adjacent first line segments in the pattern is constant and is equal to an angle formed by two adjacent second line segments in the pattern. As described above, in the present invention, the adjustment of probability of dislocation introduction into the growth layer in the underlying substrate and a mechanical strength of the underlying substrate can be realized based on angle setting.

In a preferred mode of the present invention, the pattern includes a center of gravity of the reference figure and a third line segment connecting intersections of two adjacent second line segments.

The present invention is a method for suppressing introduction of dislocations into an aluminum nitride growth layer including a processing step of removing a part of a silicon carbide substrate to form a pattern with a minor angle before forming the aluminum nitride growth layer on the silicon carbide substrate.

Advantageous Effects of Invention

According to the technique disclosed, it is possible to provide a novel technique capable of suppressing the introduction of dislocations into the aluminum nitride growth layer.

Other problems, features and advantages will become apparent by reading the following description of embodiments as well as understanding the drawings and claims.

DESCRIPTION OF EMBODIMENTS

Figure 1:
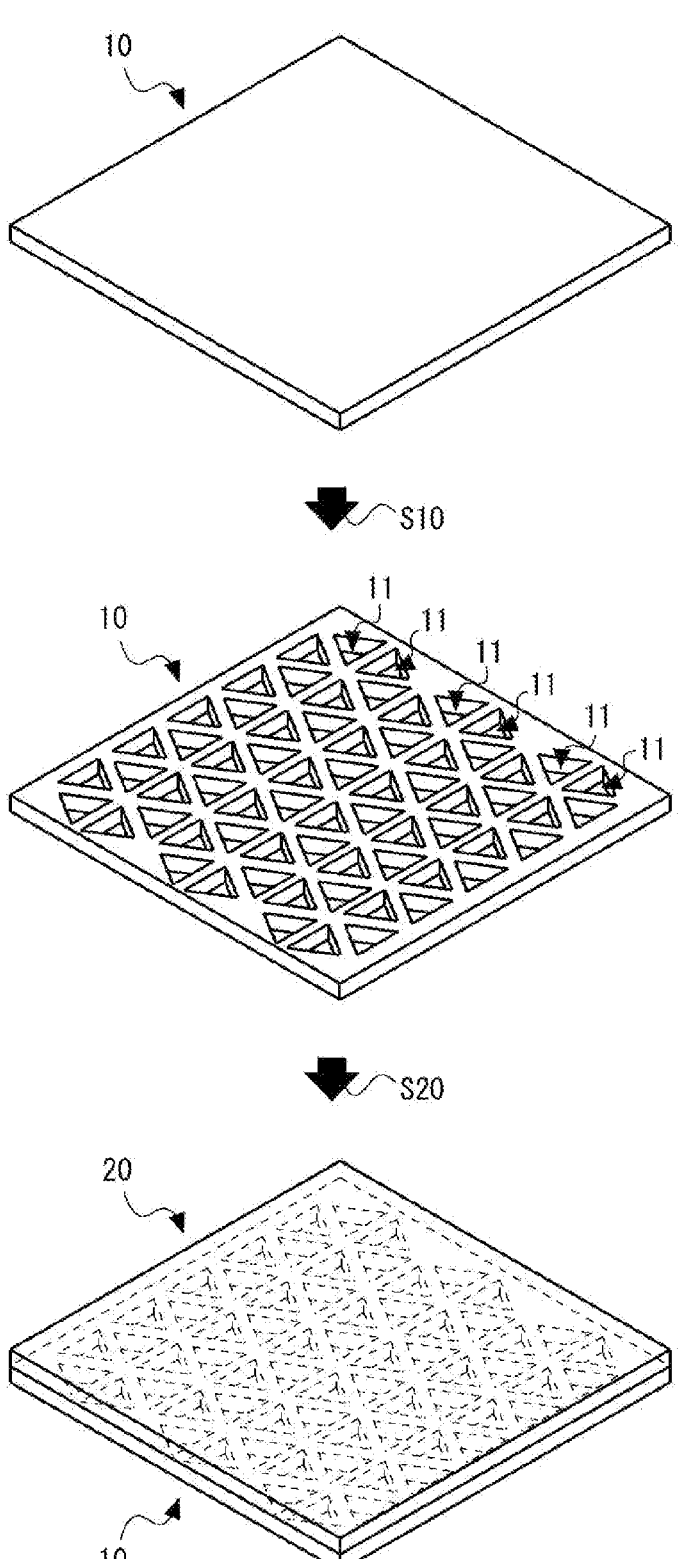
FIG. 1 is an explanatory view for explaining steps of a method for manufacturing an aluminum nitride substrate according to an embodiment.

Hereinafter, preferred embodiments of the method for manufacturing the aluminum nitride substrate according to the present invention will be described in detail with reference to the accompanying drawings.

The technical scope of the present invention is not limited to the embodiments illustrated in the accompanying drawings, and can be appropriately changed within the scope described in the claims.

The drawings attached hereto are conceptual diagrams, and the relative dimensions and the like of each member do not limit the present invention.

The present description may be referred to as an upper side or a lower side based on the upper and lower sides of the drawings for the purpose of describing the invention, but the upper and lower sides are not limited in relation to usage modes or the like of the aluminum nitride substrate of the present invention.

In addition, in the following description of the embodiments and the accompanying drawings, the same reference numerals are given to the same configurations, and redundant description is omitted.

<<Method for Manufacturing Aluminum Nitride Substrate>>

Figure 2:
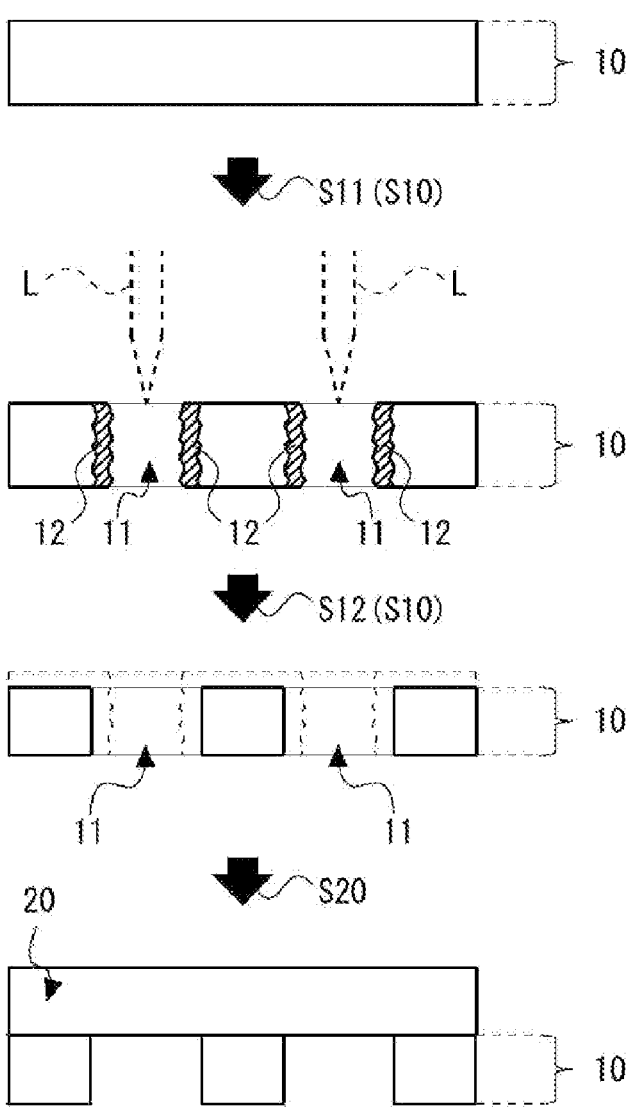
FIG. 2 is an explanatory view for explaining steps of the method for manufacturing the aluminum nitride substrate according to the embodiment.

FIGS. 1 and 2 illustrate steps of a method for manufacturing an aluminum nitride substrate according to the embodiment.

The method for manufacturing an aluminum nitride substrate according to the embodiment includes a processing step S10 of removing a part of an underlying substrate 10 to form a pattern 100 with a minor angle, and a crystal growth step S20 of forming a growth layer on the underlying substrate 10 on which the pattern 100 is formed.

Furthermore, the processing step S10 according to the embodiment, for example, can be understood to correspond to an embrittlement processing step of reducing strength of the underlying substrate 10.

Moreover, this embodiment can be understood as a method of suppressing the introduction of dislocations into the growth layer 20 by including a processing step of removing a part of the underlying substrate 10 to form the pattern with a minor angle before the growth layer 20 is formed on the underlying substrate 10.

Hereinafter, each step of the embodiment will be described in detail.

(Processing Step S10)

The processing step S10 is a step of removing a part of the underlying substrate 10 to form the pattern 100 with a minor angle.

Furthermore, it can be understood that the processing step S10 is a step of removing a part of the underlying substrate 10 to form the pattern 100 that is a periodic arrangement pattern.

In addition, "removing a part of the underlying substrate 10" in the description in the present description means removing the part including at least a surface layer of the underlying substrate 10 by a method to be described later or the like.

The term "minor angle" in the present description refers to an acute angle or an obtuse angle, which is smaller than 180°. In addition, the "pattern 100 with a minor angle" in the description of the present description corresponds to the pattern 100 in which at least one of angles constituting the pattern 100 is a minor angle.

In the processing step S10 according to the embodiment, forming through holes 11 in the underlying substrate 10 facilitates formation of a temperature gradient in the a-axis direction. Accordingly, it is possible to realize the crystal growth proceeding along the a-axis direction with the temperature gradient as the driving force.

Furthermore, the processing step S10 may be configured to form a concave portion instead of or in addition to the through holes 11. At this time, in the processing step S10, surface of the underlying substrate 10 is processed into a mesa shape.

As illustrated in FIG. 2, the processing step S10 according to the embodiment includes the through hole formation step S11 of forming the through holes 11 in the underlying substrate 10, and the strained layer removal step S12 of removing the strained layer 12 introduced in the through hole formation step S11.

The underlying substrate 10 can be naturally adopted as long as it is a material generally used in manufacturing the aluminum nitride substrate.

The material of the underlying substrate 10 is, for example, a known group IV material such as silicon (Si), germanium (Ge), or diamond (C).

Furthermore, material of the underlying substrate 10 is, for example, a known IV-IV group compound material such as SiC.

Moreover, the material of the underlying substrate 10 is a known group II-VI compound material such as zinc oxide (ZnO), zinc sulfide (ZnS), zinc selenide (ZnSe), cadmium sulfide (CdS), or cadmium telluride (CdTe).

The material of the underlying substrate 10 is, for example, a known group III-V compound material such as boron nitride (BN), gallium arsenide (GaAs), gallium nitride (GaN), aluminum nitride (AlN), indium nitride (InN), gallium phosphide (GaP), indium phosphide (InP), or indium antimonide (InSb).

Furthermore, the material of the underlying substrate 10 is, for example, an oxide material such as aluminum oxide ($Al_2O_3$) or gallium oxide ($Ga_2O_3$).

Moreover, the material of the underlying substrate 10 is, for example, a metal material such as copper (Cu) or nickel (Ni).

In addition, the underlying substrate 10 may have a configuration in which a known additive atom to be used according to the material is appropriately added.

Furthermore, the underlying substrate 10 may be a wafer or a substrate processed from a bulk crystal, or may be a substrate including a growth layer formed by an epitaxial growth.

<Through Hole Formation Step S11>

The through hole formation step S11 is a step of removing a part of the underlying substrate 10 to form the through holes 11. As the through hole formation step S11, a means for forming the through holes 11 by irradiating the underlying substrate 10 with a laser L can be exemplified.

At this time, in the through hole formation step S11, the through holes 11 are formed by scanning a focal point of the laser L from a front surface (corresponding to an upper surface) to a bottom surface (corresponding to a lower surface) of the underlying substrate 10.

Furthermore, in the through hole formation step S11, the underlying substrate 10 is irradiated with the laser L while the laser L is scanned in an in-plane direction of the underlying substrate 10.

Moreover, in the through hole formation step S11, irradiation of the underlying substrate 10 with a known ion beam (corresponding to an FIB processing) can be adopted instead of irradiation of the underlying substrate 10 with the laser L as a means for forming the through holes 11 in the underlying substrate 10.

At this time, the ion species of the ion beam described above can be appropriately selected from known ion type such as Ga⁺. Moreover, at this time, in the through hole formation step S11, the ion beam may be extracted while an acceleration voltage is appropriately applied from a known ion source such as a source gas or a liquid metal ion source.

Furthermore, in the through hole formation step S11, as a means for forming the through holes 11 in the underlying substrate 10, patterning of a hard mask on the underlying substrate 10 and known dry etching (corresponding to plasma etching) such as Deep-RIE on the underlying substrate 10 with the hard mask can be adopted instead of the irradiation of the underlying substrate 10 with the laser L.

At this time, material of the hard mask can be appropriately selected from known materials such as $SiN_x$ according to the material of the underlying substrate 10. Furthermore, at this time, an etchant in the dry etching can be appropriately selected from known gases such as $SF_6$ according to the material of the underlying substrate 10.

<Strained Layer Removal Step S12>

The strained layer removal step S12 is a step of removing the strained layer 12 formed on the underlying substrate 10 in the through hole formation step S11.

Furthermore, in the strained layer removal step S12, a means for etching the underlying substrate 10 by heat treating the underlying substrate 10 can be adopted.

Moreover, in the strained layer removal step S12, a means capable of removing the strained layer 12 can be adopted.

In addition, the strained layer removal step S12 is preferably a step of removing the strained layer 12 by thermal etching.

In the through hole formation step S11 and the strained layer removal step S12, it is desirable to adopt a method suitable for the material of underlying substrate 10.

For example, when the underlying substrate 10 is SiC, it is desirable to use a method of etching the underlying substrate 10 under a Si atmosphere in the strained layer removal step S12.

Furthermore, for example, in a case where the underlying substrate 10 is SiC, the strained layer removal step S12 may adopt a method of etching the underlying substrate 10 in a hydrogen atmosphere.

<Crystal Growth Step S20>

The crystal growth step S20 is a step of forming the growth layer 20 on the underlying substrate 10 after the processing step S10.

Material of the growth layer 20 may be the same material as the underlying substrate 10 (corresponding to a homoepitaxial growth) or may be a material different from the underlying substrate 10 (corresponding to a heteroepitaxial growth).

The material of the growth layer 20 may be a material that is generally epitaxially grown.

Furthermore, the material of the growth layer 20 may be the material of the underlying substrate 10, may be a known material that can be adopted as the material of the underlying substrate 10, or may be a known material that can be epitaxially grown on the underlying substrate 10.

The materials of the underlying substrate 10 and the growth layer 20 are, for example, respectively SiC and AlN. In other words, the underlying substrate 10 is a silicon carbide (SiC) substrate. Furthermore, in other words, the growth layer 20 is an aluminum nitride (AlN) layer.

Furthermore, the crystal growth step S20 is preferably a step of forming the growth layer 20 by physical vapor transport (PVT) method.

In the crystal growth step S20, a known vapor phase growth method (corresponding to a vapor phase epitaxial method) such as PVT, a sublimation recrystallization method, an improved Rayleigh method, or a chemical vapor transport (CVT) method can be adopted as a growth method of the growth layer 20.

Furthermore, in the crystal growth step S20, a physical vapor deposition (PVD) can be adopted instead of PVT. Moreover, in the crystal growth step S20, a chemical vapor deposition (CVD) can be adopted instead of CVT.

Then, in the crystal growth step S20, as a growth method of the growth layer 20, a known liquid phase growth method (corresponding to a liquid phase epitaxial method) such as a top-seeded solution growth (TSSG) method or a metastable solvent epitaxy (MSE) method can be adopted.

In addition, in the crystal growth step S20, a Czochralski (CZ) method can be adopted as a growth method of the growth layer 20.

In the crystal growth step S20, a growth method can be appropriately selected and adopted according to the respective materials of the underlying substrate 10 and the growth layer 20.

Figure 3:
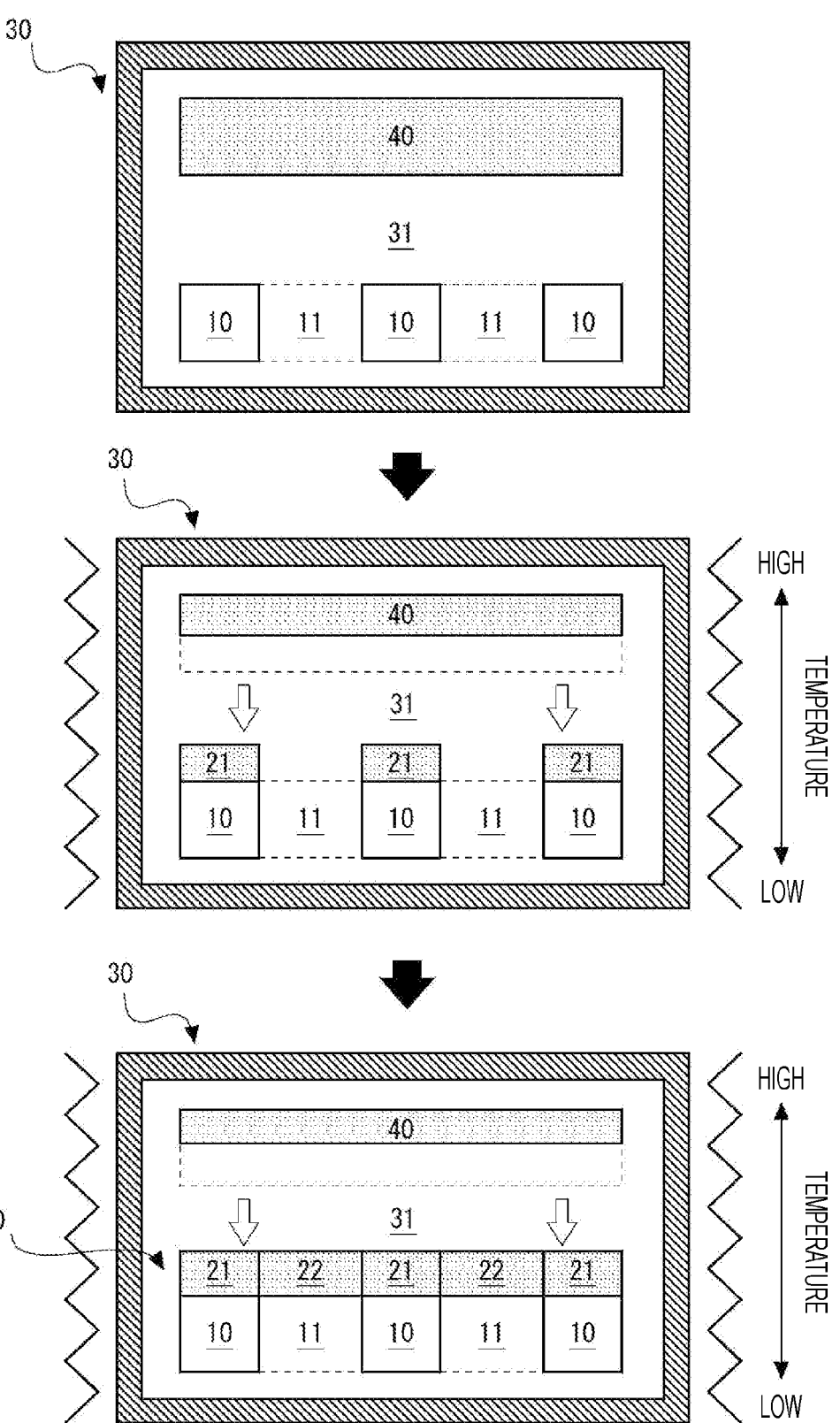
FIG. 3 is an explanatory view for explaining a crystal growth step according to the embodiment.

As illustrated in FIG. 3, the crystal growth step S20 according to the embodiment is a step in which the underlying substrate 10 and a semiconductor material 40 serving as a source of the growth layer 20 are disposed and heated in such a way as facing (confronting) each other in a crucible 30 having a quasi-closed space.

Furthermore, the term "quasi-closed space" in the present description refers to a space in which inside of a container can be vacuumed but at least a part of the steam generated in the container can be confined.

By heating the crucible 30 (the underlying substrate 10 and the semiconductor material 40), the source is transported from the semiconductor material 40 onto the underlying substrate 10 via the source transport space 31.

Furthermore, in the crystal growth step S20, the temperature gradient can be adopted as the driving force for transporting the source between the underlying substrate 10 and the semiconductor material 40.

Here, in the crystal growth step S20, a vapor composed of atomic species sublimated from the semiconductor material 40 is transported by diffusing in the source transport space 31, and is supersaturated and condensed on the underlying substrate 10 set to have a temperature lower than that of the semiconductor material 40.

In addition, in the crystal growth step S20, a chemical potential difference between the underlying substrate 10 and the semiconductor material 40 can be adopted as the driving force described above.

Here, in the crystal growth step S20, the vapor composed of atomic species sublimated from the semiconductor material 40 is transported by diffusing in the source transport space 31, and is supersaturated and condensed on the underlying substrate 10 having a chemical potential lower than that of the semiconductor material 40.

Furthermore, the crystal growth step S20 is a step of forming a land portion 21 by performing a crystal growth (corresponding to a c-axis dominant growth) along a c-axis direction from the underlying substrate 10 and forming a wing portion 22 via performing a crystal growth (corresponding to an a-axis dominant growth) along the a-axis direction from the land portion 21 to form the growth layer 20. In addition, the a-axis dominant growth may include the crystal growth along the a-axis direction from the side surface of the through holes 11 or the side surface of the concave portion.

The growth layer 20 includes the land portion 21 and the wing portion 22. The through holes 11 or the concave portion according to the embodiment are located immediately below the wing portion 22.

The "c-axis dominant growth" and the "a-axis dominant growth" in the description of the present description can be appropriately controlled based on the heating conditions in the crystal growth step S20.

The above heating conditions are, for example, the temperature gradient in the c-axis direction and the a-axis direction, and may include a history of such temperature gradient. The history corresponds to a transition or change of the temperature gradient during heating.

In addition, the above heating conditions are, for example, a back pressure or a partial pressure of an inert gas containing nitrogen gas, and may include a history of such pressure. The history corresponds to a transition or change of the back pressure or the like during heating.

The above heating conditions are, for example, heating temperature, and may include a history of such heating temperature. The history corresponds to a transition or change of heating temperature or the like during heating.

Furthermore, in the crystal growth step S20, switching of the c-axis dominant growth and the a-axis dominant growth may be performed, for example, based on the conditions, methods, and the like described in D. Dojima, et al., Journal of Crystal Growth, 483, 206 (2018).

Moreover, in the crystal growth step S20, the doping concentration of the growth layer 20 may be adjusted using a doping gas. In addition, in the crystal growth step S20, the doping concentration of the growth layer 20 may be adjusted by adopting the semiconductor material 40 having a doping concentration different from that of the underlying substrate 10.

Furthermore, the crystal growth step S20 is a step of forming the growth layer 20 by performing the zippering bonding on the underlying substrate 10.

Moreover, the zippering bonding corresponds to bonding between the crystal growth surfaces along a center line that equally divides an angle formed by two adjacent sides in the pattern 100.

Here, in the zippering bonding, it can be understood that the crystal growth surfaces are gradually bonded from a position corresponding to an intersection of the two sides.

Furthermore, in the zippering bonding, as an example, it can be understood that a portion where the bonding between the crystal growth surfaces has been performed gradually expands from the bonding portion between the crystal growth surfaces.

In addition, the crystal growth step S20 is preferably a step of forming the growth layer 20 using the underlying substrate 10 having the pattern 100 in which the zippering bonding occurs.

Here, the pattern 100 in which the zippering bonding occurs refers to, for example, the pattern 100 in which an angle θ is set such that an area 101a becomes large.

Figure 4:
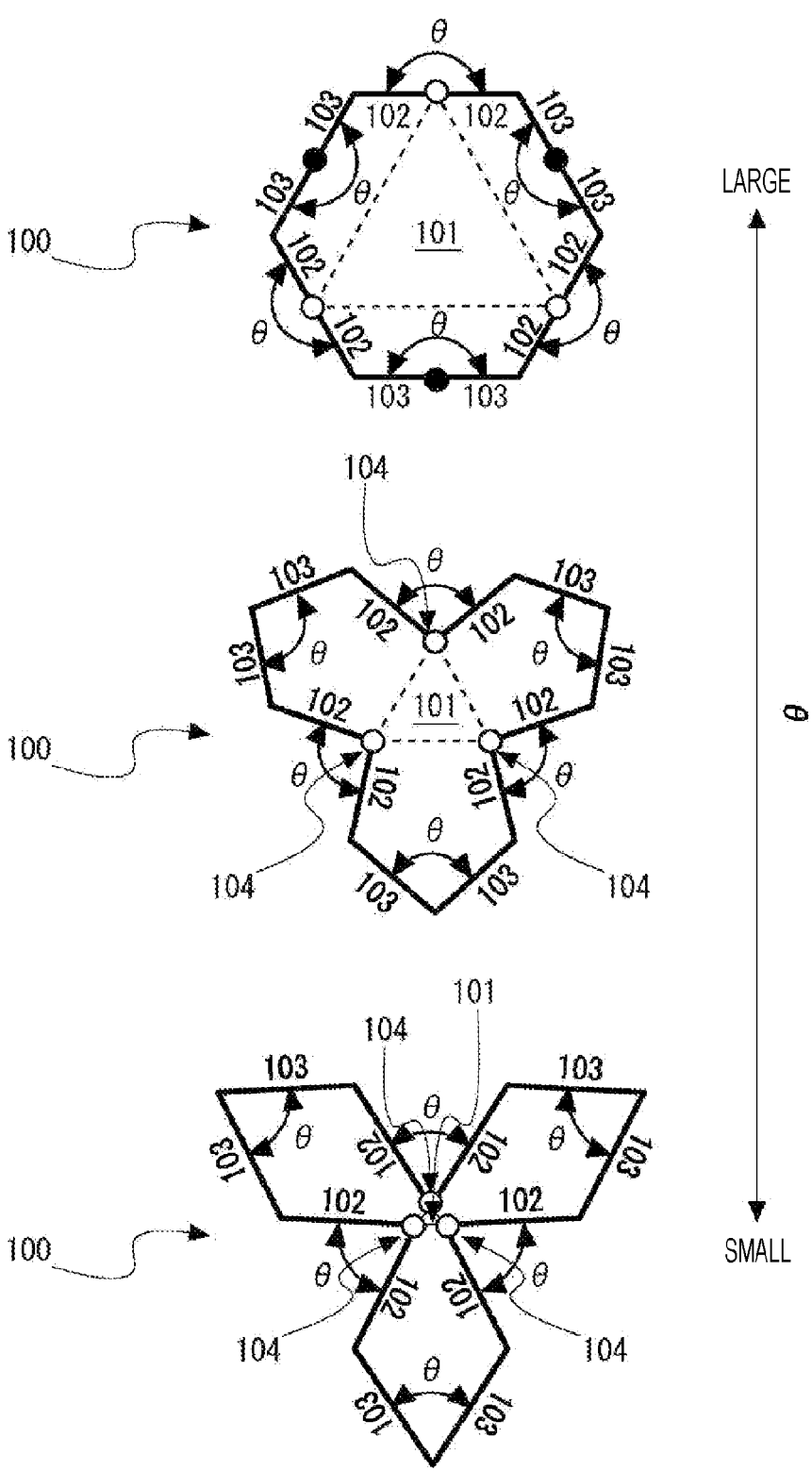
FIG. 4 is an explanatory view of a pattern according to the embodiment.

FIG. 4 is an explanatory view for explaining the pattern 100 according to the embodiment.

A line segment indicated by the pattern 100 is the underlying substrate 10. In addition, width of the line segment is not limited.

The pattern 100 preferably includes a minor angle.

Furthermore, the pattern 100 may have a configuration in which predetermined figures are periodically arranged. Moreover, the pattern 100 may have a configuration in which the predetermined figures and figures obtained by inverting or rotating the predetermined figures are arranged.

In addition, the pattern 100 includes a regular m-gonal shape as an example. At this time, m is a natural number and is larger than 2. m is, for example, 3 or 6.

Furthermore, the pattern 100 includes, as an example, a regular hexagonal displacement shape that is three-fold symmetric. The term "regular hexagonal displacement shape" in the description of the present description will be described in detail with reference to FIG. 4.

The regular hexagonal displacement shape is a 12 polygon. Furthermore, the regular hexagonal displacement shape is constituted by 12 straight line segments having the same length.

The pattern 100 having the regular hexagonal displacement shape includes a reference FIG. 101 which is regular triangle having an area 101*a* and including three vertices 104. The three vertices 104 are included in the vertices of the pattern 100. Here, it can be understood that the three vertices 104 may be located on a line segment constituting the pattern 100.

The pattern 100 includes line segments 102 (corresponding to first line segments) extending from the vertices 104 and including the vertices 104, and line segments 103 (corresponding to second line segments) not extending from the vertices 104, not including the vertices 104, and adjacent to the line segments 102.

Here, an angle θ formed by two adjacent line segments 102 in the pattern 100 is constant and is equal to an angle θ formed by two adjacent line segments 103 in the pattern 100.

Furthermore, the "regular hexagonal displacement shape" in the description of the present description can be understood as a 12 polygon in which the regular hexagon is displaced (deformed) while maintaining the area of the regular hexagon based on the angle θ indicating a degree of unevenness.

The angle θ is preferably more than 60°, preferably 66° or more, preferably 80° or more, preferably 83° or more, preferably 120° or more, preferably 150° or more, and preferably 155° or more.

In addition, the angle θ is preferably 180° or less, preferably 155° or less, preferably 150° or less, preferably 120° or less, preferably 83° or less, preferably 80° or less, and preferably 66° or less.

The pattern 100 according to the embodiment may be configured to have a regular 12 polygonal displacement shape that is six-fold symmetric instead of the regular hexagonal displacement shape that is three-fold symmetric.

The regular 12 polygonal displacement shape is a 24 polygon. Moreover, the regular 12 polygonal displacement shape is constituted by 24 straight line segments having the same length.

The pattern 100 having the regular 12 polygonal displacement shape includes reference FIG. 101 which is a regular hexagon having an area 101*a* and including six vertices 104. The six vertices 104 are included in vertices of the pattern 100. Furthermore, the area 101*a* of the regular hexagon may be equal to or different from the area 101*a* of a regular triangle described above.

Moreover, similarly to the regular hexagonal displacement shape, the angle θ formed by two adjacent line segments 102 in the pattern 100 in the regular 12 polygonal displacement shape is constant and is equal to the angle θ formed by two adjacent line segments 103 in the pattern 100.

In other words, the "regular 12 polygonal displacement shape" in the description of the present description can be understood as a 24 polygon in which the regular 12 polygon is displaced (deformed) while maintaining the area of the regular 12 polygon based on the angle θ indicating the degree of unevenness.

Furthermore, the pattern 100 has a 2n-gonal displacement shape that is a 4n-gonal shape in which a regular 2n-gonal shape is displaced (deformed) while maintaining the area of the regular 2n-gonal shape based on the angle θ indicating the degree of unevenness. Here, it can be understood that the regular n-gonal shape includes n vertices. Furthermore, when the angle θ=180°, the regular 2n-gonal displacement shape has a regular 2n-gonal shape.

At this time, it can be understood that the 2n-gonal displacement shape includes a regular n-gonal shape (corresponding to the reference FIG. 101).

The pattern 100 according to the embodiment may be configured to include a regular 2n-gonal displacement shape (the regular hexagonal displacement shape and the regular 12 polygonal displacement shape are included).

Furthermore, the pattern 100 may further include at least one of the center of gravity of the reference FIG. 101 and the line segment (corresponding to the third line segment.) connecting the intersection of two adjacent line segments 103 in the regular 2n-gonal displacement shape, in addition to the line segment constituting the regular 2n-gonal displacement shape.

Moreover, the pattern 100 may further include at least one of the vertices 104 constituting the reference FIG. 101 and a line segment connecting an intersection of two adjacent line segments 103 in the regular n-gonal displacement shape, in addition to the line segment constituting the regular n-gonal displacement shape.

In addition, the pattern 100 may further include at least one of line segments constituting the reference FIG. 101 included in the regular n-gonal displacement shape, in addition to the line segments constituting the regular n-gonal displacement shape.

The present invention will be described more specifically with reference to Examples 1 and 2 and the comparative example.

Example 1 illustrates an example in which the growth layer 20 that is an AlN layer is formed on the underlying substrate 10 that is a SiC substrate. The underlying substrate 10 according to Example 1 has the pattern 100 including the regular hexagonal deformation and with a minor angle.

Example 2 illustrates an example in which the growth layer 20 that is an AlN layer is formed on the underlying substrate 10 that is a SiC substrate. The underlying substrate 10 according to Example 2 has the pattern 100 including a regular triangular deformation and with a minor angle.

The comparative example shows an example in which the growth layer 20 that is an AlN layer is formed on the underlying substrate 10 that is a SiC substrate. The underlying substrate 10 according to Example 2 has a pattern 100 without a minor angle.

Example 1

Hereinafter, Example 1 will be described in detail.
<Processing Step>
The processing step S10 according to Example 1 is a step of removing a part of the underlying substrate 10 under the following conditions to form the pattern 100 with a minor angle.
(Underlying Substrate 10)
    Semiconductor material: 4H—SiC
    Substrate size: width 10 mm×length 10 mm×thickness
      524 μm Growth surface: Si-face Off angle: on-axis (Through Hole Formation Step S11)

The through hole formation step S11 according to Example 1 is a step of forming the through holes 11 by irradiating the underlying substrate 10 with the laser L.

(Laser Processing Conditions)

Wavelength: 532 nm

Output power: 3 W/cm$^2$

Spot diameter: 40 μm (Pattern Details)

Figure 5:
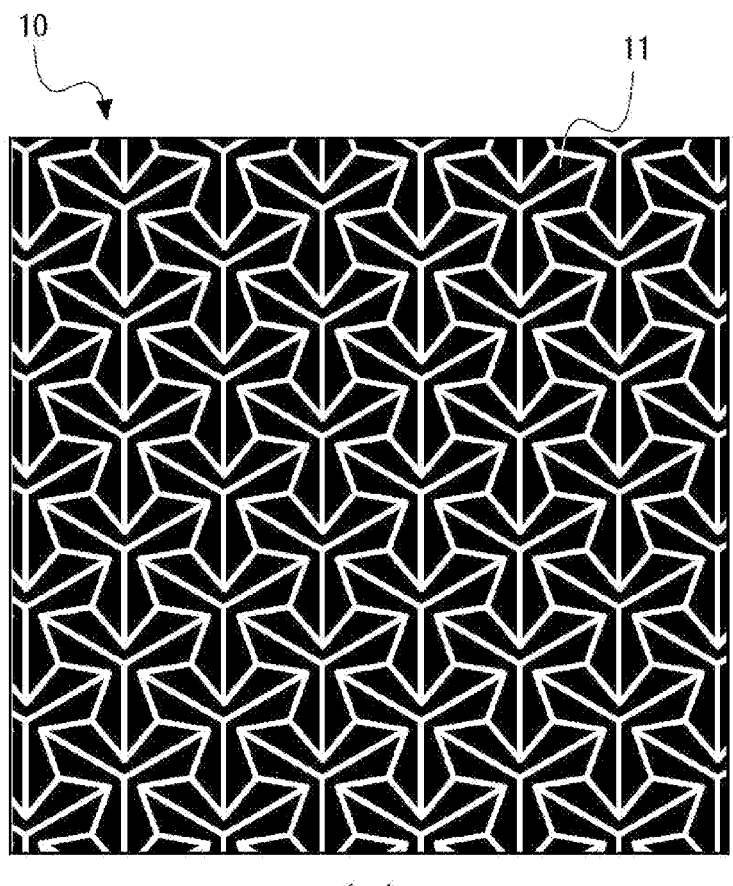
FIG. 5 is an explanatory view of a pattern according to Example 1.
Figure 5:
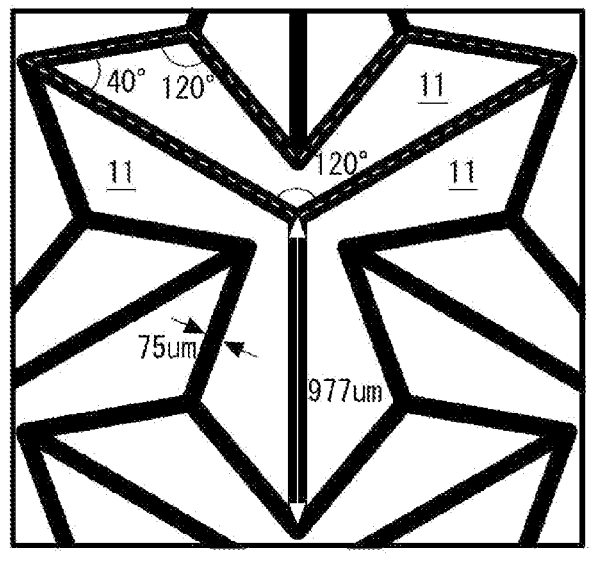

FIG. 5 is an explanatory view for explaining the pattern 100 of the through holes 11 formed in the through hole formation step S11 according to Example 1. Black regions indicate a portion of the through holes 11, and white regions remain as the underlying substrate 10.

In addition, it can be understood that the pattern 100 exemplified in FIG. 5 has a regular hexagonal displacement shape, has an angle θ=80°, and includes a line segment connecting an intersection of two adjacent line segments 103 and the center of gravity of the reference FIG. 101.

Here, the pattern 100 according to Example 1 has a width of about 100 μm.

(Strained Layer Removal Step S12)

The strained layer removal step S12 according to Example 1 is a step of removing the strained layer 12 formed on the underlying substrate 10 in the through hole formation step S11 by thermal etching.

Figure 6:
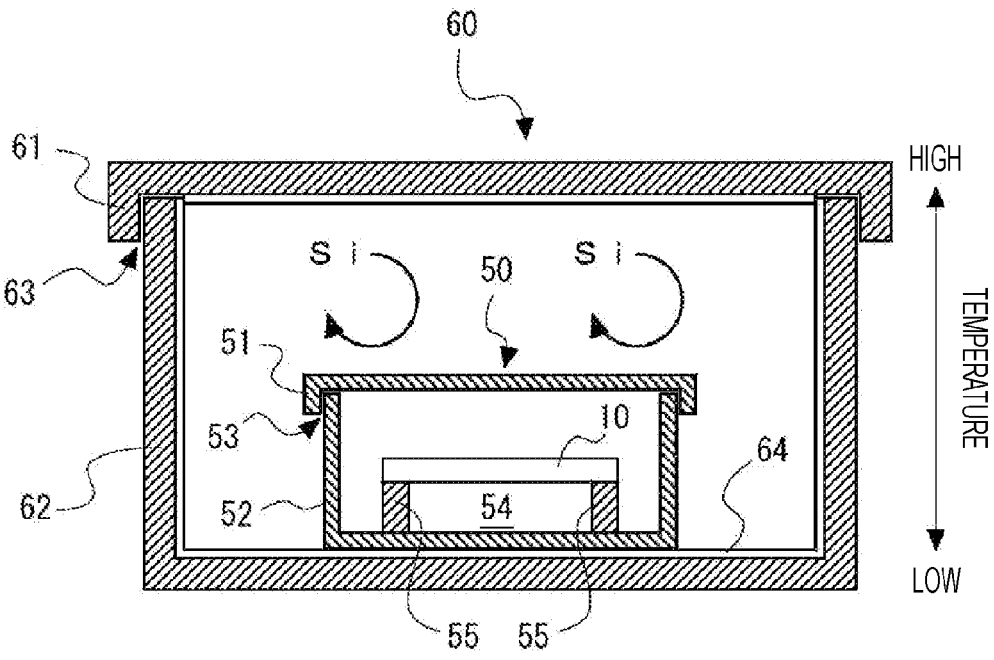
FIG. 6 is an explanatory view of a strained layer removal step according to Example 1.

FIG. 6 is an explanatory view for explaining the strained layer removal step S12 according to Example 1. In the strained layer removal step S12 according to Example 1, the underlying substrate 10 is housed in the SiC container 50, and a SiC container 50 is further housed in a TaC container 60 and heated.

(SiC Container 50)

Material: polycrystalline SiC

Container size: diameter 60 mm×height 4 mm

Distance between the underlying substrate 10 and bottom surface of the SiC container 50: 2 mm (Details of SiC Container 50)

As illustrated in FIG. 6, the SiC container 50 is a fitting container including an upper container 51 and a lower container 52 that can be fitted to each other.

A gap 53 is formed in a fitting portion between the upper container 51 and the lower container 52, and the SiC container 50 can be exhausted (evacuated) from the gap 53.

The SiC container 50 has an etching space 54 formed by making a part of the SiC container 50 arranged on the low temperature side of the temperature gradient face the underlying substrate 10 in a state where the underlying substrate 10 is arranged on the high temperature side of the temperature gradient.

The etching space 54 is a space for transporting and etching Si atoms and C atoms from the underlying substrate 10 to the SiC container 50 using a temperature difference provided between the underlying substrate 10 and the bottom surface of the SiC container 50 as the driving force.

Furthermore, the SiC container 50 includes a substrate holder 55 that holds the underlying substrate 10 in a hollow state to form the etching space 54.

Furthermore, the SiC container 50 may not be provided with the substrate holder 55 depending on the direction of the temperature gradient of a heating furnace.

For example, when the SiC container 50 forms the temperature gradient such that the heating furnace decreases in temperature from the lower container 52 toward the upper container 51, the underlying substrate 10 may be arranged on the bottom surface of the lower container 52 without providing the substrate holder 55.

(TaC Container 60)

Material: TaC

Container size: diameter 160 mm×height 60 mm

Si vapor supply source 64 (Si compound): TaSi$_2$ (Details of TaC Container 60)

Similarly to the SiC container 50, the TaC container 60 is a fitting container including an upper container 61 and a lower container 62 that can be fitted to each other, and is configured to be able to house the SiC container 50.

A gap 63 is formed in a fitting portion between the upper container 61 and the lower container 62, and the TaC container 60 can be exhausted (evacuated) from the gap 63.

The TaC container 60 includes the Si vapor supply source 64 capable of supplying the vapor pressure of the vapor phase species containing Si element to the TaC container 60.

The Si vapor supply source 64 may be configured to generate the vapor pressure of the vapor phase species containing Si element in the TaC container 60 during heat treatment.

(Heating Conditions)

The underlying substrate 10 arranged under the conditions described above was subjected to heat treatment under the following conditions.

Heating temperature: 1800° C.

Etching amount: 8 μm

Furthermore, in the strained layer removal step S12, the heating time and the temperature gradient are appropriately set in order to realize the following etching amount.

<Crystal Growth Step S20>

The crystal growth step S20 according to Example 1 is a step of forming the growth layer 20 on the underlying substrate 10 after the processing step S10.

Figure 7:
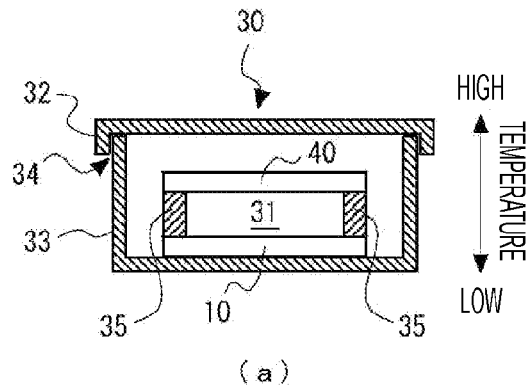
FIG. 7 is an explanatory view of a crystal growth step according to Example 1.
Figure 7:
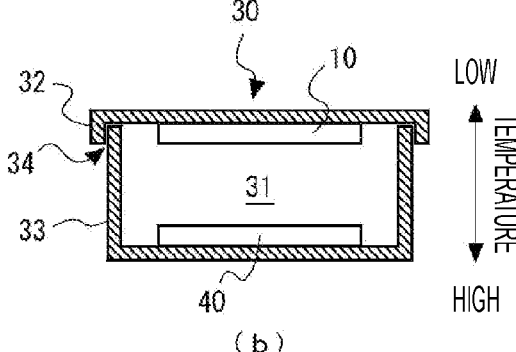
Figure 7:
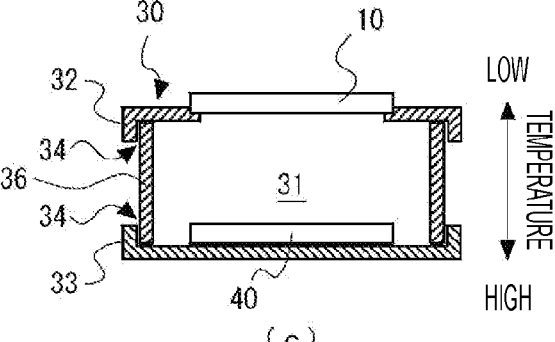

FIG. 7 is an explanatory view for explaining the crystal growth step S20 according to Example 1. The crystal growth step S20 according to Example 1 is a step of housing the underlying substrate 10 in the crucible 30 and heating the underlying substrate in such a way to face the semiconductor material 40.

(Crucible 30)

Material: TaC

Container size: 10 mm×10 mm×1.5 mm

Distance between the underlying substrate 10 and the semiconductor material 40: 1 mm (Details of Crucible 30)

The crucible 30 has the source transport space 31 between the underlying substrate 10 and the semiconductor material 40. A source is transported from the semiconductor material 40 onto the underlying substrate 10 through the source transport space 31.

FIG. 7(a) is an example of the crucible 30 to be used in the crystal growth step S20. Similarly to the SiC container 50 and the TaC container 60, the crucible 30 is a fitting container including an upper container 32 and a lower container 33 that can be fitted to each other. A gap 34 is formed in a fitting portion between the upper container 32 and the lower container 33, and the crucible 30 can be exhausted (evacuated) from the gap 34.

Further, the crucible 30 includes a substrate holder 35 that forms the source transport space 31. The substrate holder 35 is provided between the underlying substrate 10 and the semiconductor material 40, and forms the source transport space 31 by arranging the semiconductor material 40 on the high temperature side and the underlying substrate 10 on the low temperature side.

FIGS. 7(*b*) and 7(*c*) are another example of the crucible 30 to be used in the crystal growth step S20. The temperature gradient in FIGS. 7(*b*) and 7(*c*) is set opposite to the temperature gradient in FIG. 7(*a*), and the underlying substrate 10 is disposed on an upper side. In other words, similarly to FIG. 7(*a*), the semiconductor material 40 is disposed on the high temperature side, and the underlying substrate 10 is disposed on the low temperature side to form the source transport space 31.

FIG. 7(*b*) illustrates an example in which the underlying substrate 10 is fixed to the upper container 32 side to form the source transport space 31 with the semiconductor material 40.

FIG. 7(*c*) illustrates an example in which the source transport space 31 is formed between the semiconductor material 40 and the underlying substrate 10 by forming a through window in the upper container 32 and arranging the underlying substrate. Furthermore, as illustrated in FIG. 7(*c*), an intermediate member 36 may be provided between the upper container 32 and the lower container 33 to form the source transport space 31.

In addition, the material of the crucible 30 may be a refractory material such as W (tungsten) instead of TaC.
(Semiconductor Material 40)
   Material: AlN sintered body
   Size: width 20 mm×length 20 mm×thickness 5 mm
(Details of Semiconductor Material 40)
   An AlN sintered body of the semiconductor material was prepared in the following procedure.

First, in Example 1, the AlN powder was put in the frame of a TaC block. Then, in Example 1, the AlN powder was compacted by mechanically applying an external force to the AlN powder. Next, in Example 1, the compacted AlN powder and the TaC block were housed in a thermal decomposition carbon crucible and heated under the following conditions.

In the crystal growth step S20, the underlying substrate 10 and the semiconductor material 40 were arranged in the crucible 30 and heated under the following heating conditions.
(Heating Conditions)
   Heating temperature: 2040° C.
   Heating time: 70 hours
   Growth thickness: 500 μm
   Temperature gradient: 6.7 K/mm
   $N_2$ gas pressure: 10 kPa FIG. 8 illustrates a mapping of the full width at half maximum (FWHM) of the $E_2$ peak obtained by Raman spectrometry for the growth layer 20 formed under the conditions above.

Figure 8:
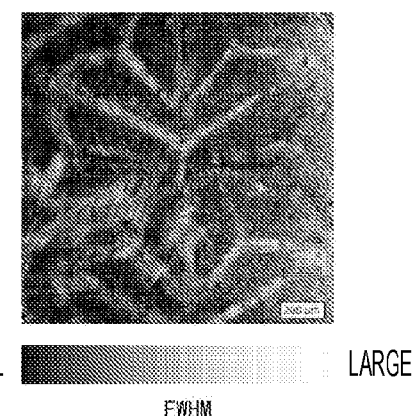
FIG. 8 is a Raman spectroscopic measurement result of a growth layer 20 according to Example 1.

According to FIG. 8, it can be understood that the AlN layer having a poor crystallinity is formed in the land portion 21 and the AlN layer having a good crystallinity is formed in the wing portion 22. In addition, it can be understood that the land portion 21 corresponds to the line segment of the pattern 100.

Figure 9:
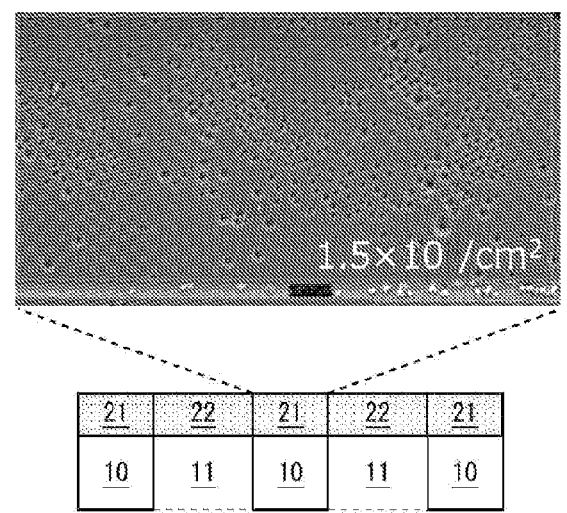
FIG. 9 is an observation image of a land portion after KOH etching according to Example 1.

FIG. 9 is an SEM observation image of a surface of the land portion 21 of the growth layer 20 formed under the above conditions, in which the dislocations of the land portion 21 are exposed by an etch pit method. The etch pit method was performed based on KOH wet etching.

According to FIG. 9, it can be understood that the land portion 21 according to Example 1 has a dislocation density (corresponding to the etch pit density) of $1.5 \times 10^8$ cm$^{-2}$.

Figure 10:
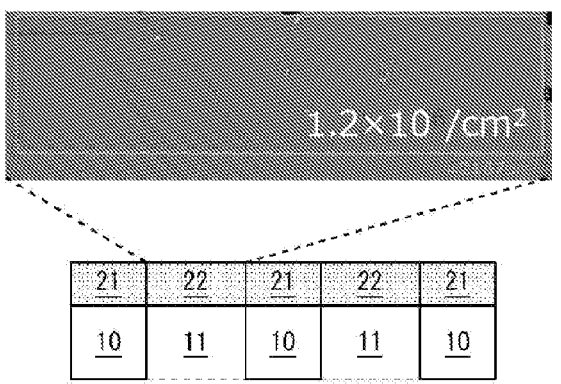
FIG. 10 is an observation image of a wing portion after KOH etching according to Example 1.

FIG. 10 is an SEM observation image of the surface of the wing portion 22 of the growth layer 20 formed under the conditions above, in which the dislocations of the wing portion 22 are exposed by the etch pit method. The etch pit method was performed based on KOH wet etching.

According to FIG. 10, it can be understood that the wing portion 22 according to Example 1 has the dislocation density (corresponding to etch pit density) of $1.2 \times 10^6$ cm$^{-2}$.

According to FIGS. 9 and 10, it can be understood that introduction of dislocations into the wing portion 22 is suppressed in the formation of the growth layer 20 on the underlying substrate 10.

Example 2

Hereinafter, Example 2 will be described in detail. Furthermore, in this description, description of configurations and conditions common to Example 1 and the embodiment will be omitted.

The underlying substrate 10 according to Example 2 has a concave portion instead of the through holes 11.

The pattern 100 according to Example 2 includes a regular triangle. Here, the line segments constituting the pattern 100 have a width of up to 60 μm.

Figure 11:
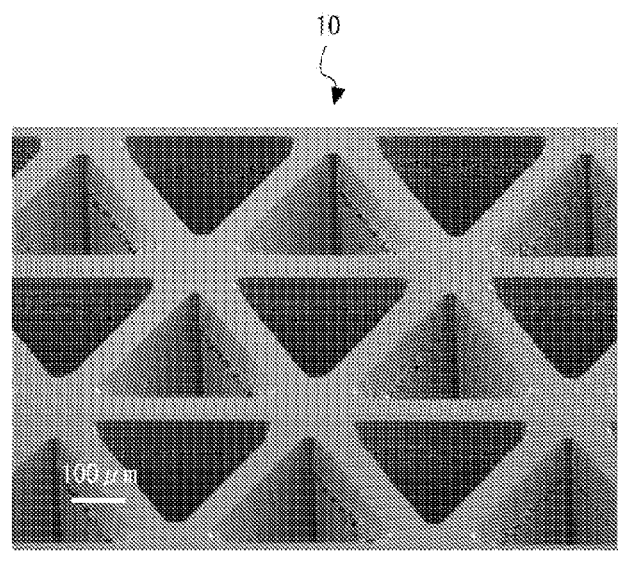
FIG. 11 is an observation image of an underlying substrate 10 according to Example 2.

FIG. 11 is an SEM observation image of the underlying substrate 10 after the processing step S10 according to Example 2.

Figure 12:
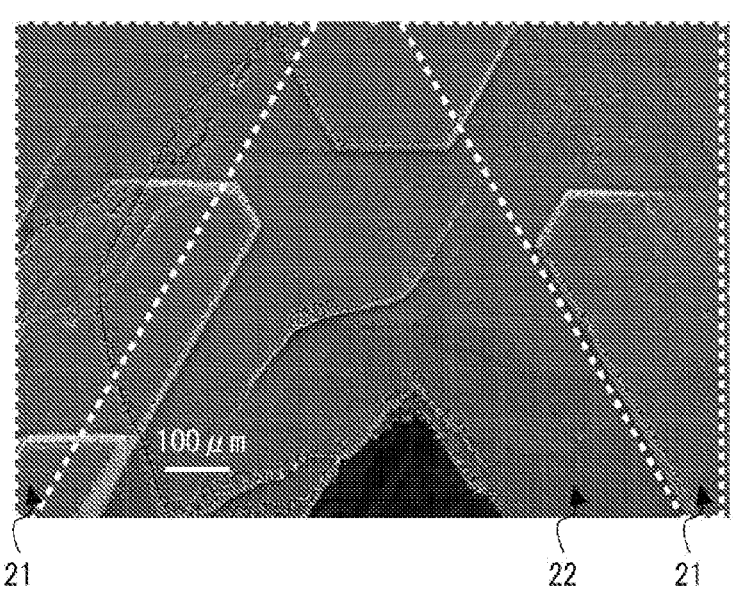
FIG. 12 is an observation image of a growth layer 20 after KOH etching according to Example 2.

In the crystal growth step S20, the underlying substrate 10 and the semiconductor material 40 were arranged in the crucible 30 and heated under the following heating conditions.
(Heating Conditions)
   Heating temperature: 1840° C.
   $N_2$ gas pressure: 50 kPa FIG. 12 is an observation image obtained by performing SEM observation of the surface of the growth layer 20 on which dislocations of the growth layer 20 are exposed by the etch pit method for the growth layer formed under the above conditions. The etch pit method was performed based on KOH wet etching.

According to FIG. 12, it can be understood that introduction of dislocations into the wing portion 22 is suppressed in the formation of the growth layer 20 on the underlying substrate 10 having the pattern 100 with a minor angle.

Comparative Example

Hereinafter, the comparative example will be described in detail. Furthermore, in this description, description of configurations and conditions common to Example 1 and the embodiment will be omitted.

The underlying substrate 10 according to the comparative example has a concave portion instead of the through holes 11 as in Example 2.

The pattern 100 according to the comparative example does not include a minor angle or an intersection. The line segments constituting the pattern 100 according to the comparative example are parallel to each other. Here, the line segments constituting the pattern 100 have a width of up to 60 μm.

Figure 13:
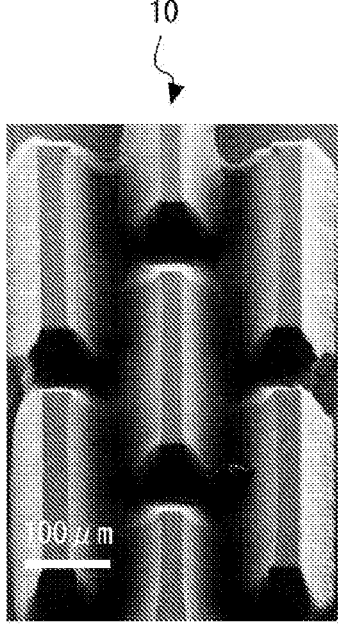
FIG. 13 is an observation image of the underlying substrate 10 according to a comparative example.

FIG. 13 is an SEM observation image of the underlying substrate 10 after the processing step S10 according to the comparative example.

Figure 14:
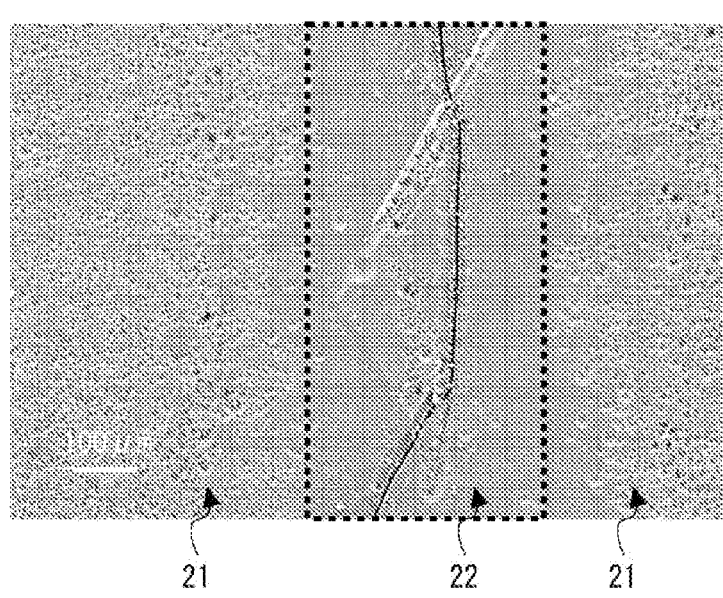
FIG. 14 is an observation image of the growth layer 20 after KOH etching according to a comparative example.

In the crystal growth step S20, the underlying substrate 10 and the semiconductor material 40 were arranged in the crucible 30 and heated under the following heating conditions.
(Heating Conditions)
   Heating temperature: 1840° C.
   $N_2$ gas pressure: 50 kPa FIG. 14 is an observation image obtained by performing SEM observation of the surface of the growth layer 20 on which dislocations of the growth layer 20 are exposed by the etch pit method for the growth layer 20 formed under the conditions above. The etch pit method was performed based on KOH wet etching.

According to FIG. 14, in the formation of the growth layer 20 on the underlying substrate 10 having the pattern 100 without a minor angle, it can be understood that the introduction of the dislocations into the wing portion 22 occurs particularly in a central portion (this corresponds to a bonding portion of the crystal growth surface) of the wing portion 22 in FIG. 14.

Furthermore, it can be understood from FIGS. 12 and 14 that the dislocation density in a bonding region (this corresponds to a central region of the wing portion 22 in FIGS. 12 and 14) of the crystal growth surface in the wing portion 22 according to Example 2 is suppressed to be lower than that in Comparative Example 1.

In the a-axis dominant growth in FIG. 12, since the bonding of the crystal growth surface in the formation of the growth layer 20 was performed in the form of zippering bonding, it can be understood that the introduction of new dislocations due to the bonding of the crystal growth surface was suppressed.

According to the present invention, by including the processing step S10 of removing a part of the underlying substrate 10 to form the pattern 100 with a minor angle and the crystal growth step S20 of forming the growth layer 20 on the underlying substrate 10 on which the pattern 100 is formed, the introduction of dislocations into the growth layer 20 can be suppressed.

10 Underlying substrate
11 Through hole
12 Strained layer
20 Growth layer
21 Land portion
22 Wing portion
30 Crucible
31 Source transport space
40 Semiconductor material
50 SiC container
60 TaC container
S10 Processing step
S11 Through hole formation step
S12 Strained layer removal step
S20 Crystal growth step

The invention claimed is:

1. A method for manufacturing an aluminum nitride substrate, the method comprising: a processing step of removing a part of a silicon carbide substrate to form a pattern with a minor angle; and a crystal growth step of forming an aluminum nitride growth layer on the silicon carbide substrate on which the pattern is formed,
wherein the processing step includes a through hole formation step of removing a part of the silicon carbide substrate to form through holes.

2. The method for manufacturing an aluminum nitride substrate according to claim 1, wherein in the crystal growth step, a zippering bonding is performed on the silicon carbide substrate to form the aluminum nitride growth layer.

3. The method for manufacturing an aluminum nitride substrate according to claim 1, wherein in the crystal growth step, the aluminum nitride growth layer is formed by performing a crystal growth proceeding along a c-axis direction and performing a crystal growth proceeding along an a-axis direction.

4. The method for manufacturing an aluminum nitride substrate according to claim 1, wherein the crystal growth step is a step of growing by a physical vapor transport method.

5. The method for manufacturing an aluminum nitride substrate according to claim 1, wherein the silicon carbide substrate and the aluminum nitride growth layer are made of different materials.

6. The method for manufacturing an aluminum nitride substrate according to claim 1, wherein the processing step includes a strained layer removal step of removing a strained layer introduced in the through hole formation step.

7. The method for manufacturing an aluminum nitride substrate according to claim 6, wherein the through hole formation step is a step of forming the through holes by irradiating the silicon carbide substrate with a laser.

8. The method for manufacturing an aluminum nitride substrate according to claim 6, wherein the strained layer removal step is a step of removing the strained layer of the silicon carbide substrate by heat treatment.

9. The method for manufacturing an aluminum nitride substrate according to claim 6, wherein the silicon carbide substrate is silicon carbide, and the strained layer removal step is a step of etching the silicon carbide substrate under a silicon atmosphere.

10. The method for manufacturing an aluminum nitride substrate according to claim 1, wherein the pattern includes a regular m-gonal shape and the m is a natural number larger than 2.

11. A method for manufacturing an aluminum nitride substrate comprising: a processing step of removing a part of a silicon carbide substrate to form a pattern with a minor angle; and a crystal growth step of forming an aluminum nitride growth layer on the silicon carbide substrate on which the pattern is formed, wherein the pattern includes a 4n-gonal shape, including a reference figure which is a regular n-gonal shape including n vertices included in vertices of the pattern, a first line segment extending from each of the n vertices and a second line segment adjacent to the first line segment without extending from any of the n vertices, the n is a natural number larger than 2, and an angle formed by two adjacent first line segments in the pattern is constant and is equal to an angle formed by two adjacent second line segments in the pattern.

12. The method for manufacturing an aluminum nitride substrate according to claim 11, wherein the pattern includes a center of gravity of the reference figure and a third line segment connecting intersections of two adjacent second line segments.

13. An aluminum nitride substrate manufactured via the manufacturing method according to claim 1.

14. A method for suppressing introduction of dislocations into an aluminum nitride growth layer, the method comprising: a processing step of removing a part of a silicon carbide substrate before forming the aluminum nitride growth layer on the silicon carbide substrate to form a pattern with a minor angle,
wherein the processing step includes a through hole formation step of removing a part of the silicon carbide substrate to form through holes.

15. The method for manufacturing an aluminum nitride substrate according to claim 2, wherein in the crystal growth step, the aluminum nitride growth layer is formed by performing a crystal growth proceeding along a c-axis direction and performing a crystal growth proceeding along an a-axis direction.

16. The method for manufacturing an aluminum nitride substrate according to claim 15, wherein the crystal growth step is a step of growing by a physical vapor transport method.

17. The method for manufacturing an aluminum nitride substrate according to claim 16, wherein the silicon carbide substrate and the aluminum nitride growth layer are made of different materials.

18. The method for manufacturing an aluminum nitride substrate according to claim 17, wherein the processing step includes a strained layer removal step of removing a strained layer introduced in the through hole formation step.

19. The method for manufacturing an aluminum nitride substrate according to claim 18, wherein the through hole formation step is a step of forming the through holes by irradiating the silicon carbide substrate with a laser.

20. The method for manufacturing an aluminum nitride substrate according to claim 19, wherein the strained layer removal step is a step of removing the strained layer of the silicon carbide substrate by heat treatment.

* * * * *